(12) United States Patent
Chen

(10) Patent No.: US 7,218,153 B2
(45) Date of Patent: May 15, 2007

(54) WORD LINE DRIVER WITH REDUCED LEAKAGE CURRENT

(75) Inventor: Yen-Huei Chen, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 102 days.

(21) Appl. No.: 11/208,575

(22) Filed: Aug. 22, 2005

(65) Prior Publication Data

US 2007/0040581 A1    Feb. 22, 2007

(51) Int. Cl.
H03K 19/094    (2006.01)
H03K 19/21     (2006.01)

(52) U.S. Cl. .................... 326/113; 326/55; 326/121

(58) Field of Classification Search .............. 326/27, 326/34, 52, 54, 55, 83, 112, 113, 121
See application file for complete search history.

(56) References Cited

U.S. PATENT DOCUMENTS 7,126,389 B1 * 10/2006 McRae et al. .............. 327/112

FOREIGN PATENT DOCUMENTS

JP    02290330 A  * 11/1990
JP    04241517 A  *  8/1992

* cited by examiner

Primary Examiner—Daniel Chang
(74) Attorney, Agent, or Firm—K & L Gates LLP

(57) ABSTRACT

A circuit system having a first inverter, a second inverter and a blockage module is disclosed. The first inverter is coupled between a supply voltage and a complementary input signal, for generating a first output signal on an output terminal thereof in response to an input signal received by an input terminal of the same. The blockage module is coupled to the output terminal of the first inverter for selectively passing the first output signal there across in response to the input signal and the complementary input signal. The second inverter is coupled between the supply voltage and a complementary supply voltage, having a first input terminal directly coupled to the output terminal of the first inverter and a second input terminal coupled to the same via the blockage module for generating a second output signal in response to the first output signal.

20 Claims, 2 Drawing Sheets

WORD LINE DRIVER WITH REDUCED LEAKAGE CURRENT

BACKGROUND

The present invention relates generally to integrated circuit (IC) designs, and more particularly to a word line driver for a memory device.

A typical static random access memory (SRAM) device often includes a word line driver for receiving a word select signal from a decoder. The word line driver usually includes inverters made of devices that are short in channel length and wide in width. These inverters are used for adjusting voltage levels on word lines during programming and reading operations. The inverter usually includes a couple of PMOS and NMOS transistors serially connected between a supply voltage and a complementary supply voltage for generating an inverted output signal in response to an input signal.

One challenge for improving the power efficiency of the word line driver is to reduce its leakage current during a standby mode. Conventionally, the word line driver includes two stages of inverters, each having a set of serially coupled PMOS transistor and NMOS transistor. During the standby mode, a substantial leakage current would occur at the gate of the NMOS transistor within the second stage inverter, thereby wasting electrical power. For example, in a conventional word line driver having an NMOS transistor with a 3.8 μm width and a 0.1 μm length implemented in its second stage inverter, the gate leakage current of the transistor can reach about 589 nA during the standby mode where the supply voltage is lowered to about 1.2 volts. In such scenario, the total leakage current of the word line driver is about 864 nA. This shows that the gate leakage current is a predominant portion of the total standby leakage current.

Thus, what is needed is a word line driver with reduced gate leakage current in the standby mode.

SUMMARY

According to one embodiment of the present invention, a circuit system having a first inverter, a second inverter and a blockage module is disclosed. The first inverter is coupled between a supply voltage and a complementary input signal, for generating a first output signal on an output terminal thereof in response to an input signal received by an input terminal of the same. The blockage module is coupled to the output terminal of the first inverter for selectively passing the first output signal there across in response to the input signal and the complementary input signal. The second inverter is coupled between the supply voltage and a complementary supply voltage, having a first input terminal directly coupled to the output terminal of the first inverter and a second input terminal coupled to the same via the blockage module for generating a second output signal in response to the first output signal. The blockage module prevents the first output signal from passing to the second input terminal of the second inverter when the input signal is at a low level and the complementary input signal is at a high level, thereby reducing a leakage current at the second inverter.

The construction and method of operation of the invention, however, together with additional objectives and advantages thereof will be best understood from the following description of specific embodiments when read in connection with the accompanying drawings.

DESCRIPTION

Figure 1:
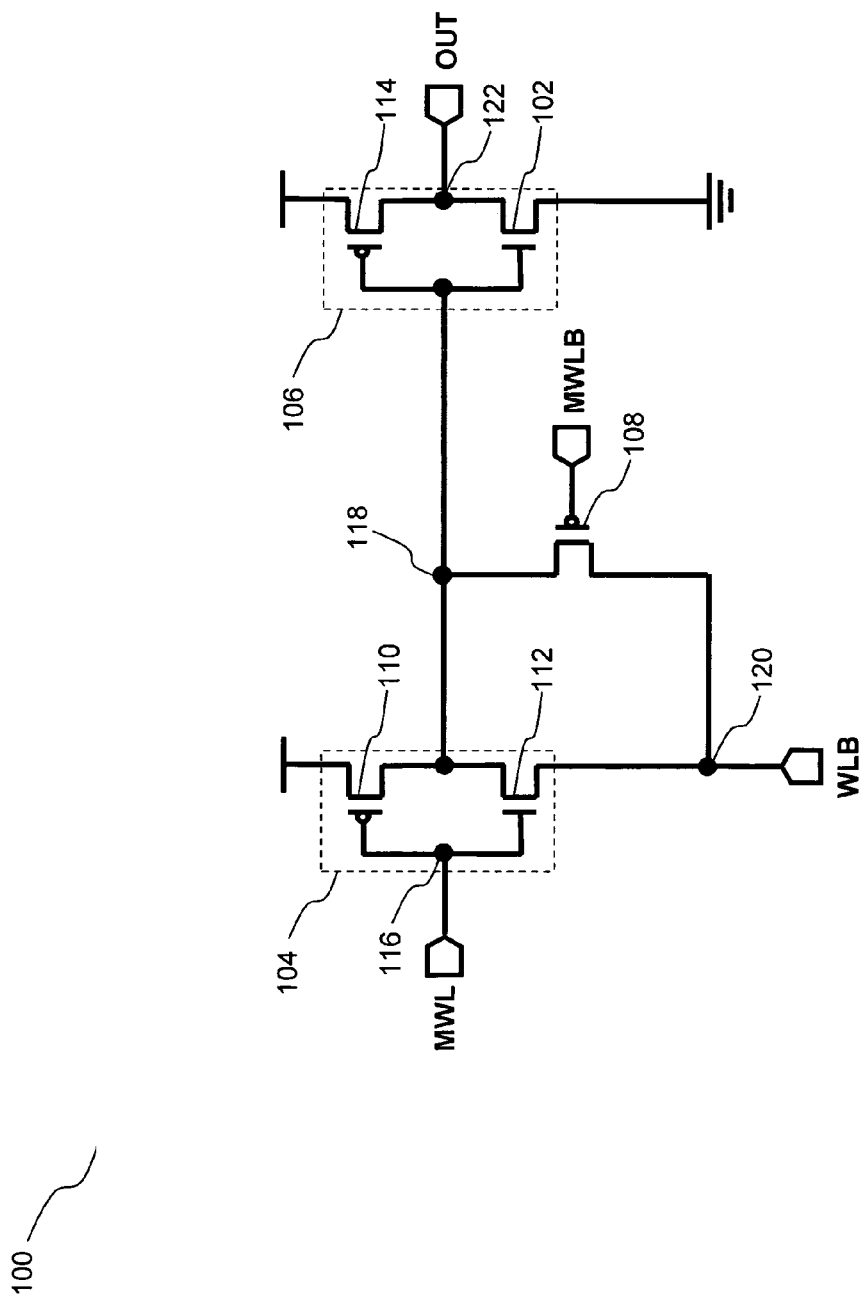
FIG. 1 illustrates a conventional word line driver for a memory device.

FIG. 1 illustrates a conventional word line driver 100 for a memory device. The word line driver 100 includes two stages of inverters 104 and 106 and a PMOS transistor 108. The inverter 104 includes a PMOS transistor 110 and an NMOS transistor 112, while the inverter 106 includes a PMOS transistor 114 and an NMOS transistor 102. The gates of the PMOS transistor 110 and the NMOS transistor 112 are coupled together at a node 116, which serves as an input terminal of the inverter 104 for receiving an input signal MWL. The source of the PMOS transistor 110, is tied to a supply voltage while the drains of the PMOS transistors 110 and the NMOS transistor 112 are coupled together at a node 118, which can be seen as an output terminal of the inverter 104. The source of the NMOS transistor 112 is connected to a node 120 where a signal WLB is provided. For the PMOS transistor 108, the drain is also connected to the node 120 while its source is coupled to the node 118. Another input signal MWLB, that is the complement of the input signal MWL, is provided at the gate of the PMOS transistor 108. In the inverter 106, the gates of the PMOS transistor 114 and the NMOS transistor 102 are coupled together at the node 118, which is connected to an input terminal thereof. The source of the PMOS transistor 114 is tied to the supply voltage, and the source of the NMOS transistor 102 is coupled to a complementary supply voltage, such as ground. The drains of the PMOS transistor 114 and the NMOS transistor 102 are coupled together at a node 122 which serves as an output terminal of the inverter 106.

The input signal MWL and the signal WLB are designed to be at opposite states, similar to the complementary input signal MWLB. During the normal operation, when the input signal MWL at the node 116 is at a high state, the signal WLB at the node 120 will be at a low state. The NMOS transistor 112 will be turned on and the node 118 will be at a low state. The PMOS transistor 108 will be turned on by the complementary input signal MWLB, which is the inverted signal of the input signal MWL, thereby further pulling the node 118 to a low state. The low signal at the node 118 will turn on the PMOS transistor 114 and turn off the NMOS transistor 102, thereby pulling the node 122 high to provide a high output signal.

In the standby mode, when the input signal MWL at the node 116 is at a low state, the signal WLB at the node 120 will be at a high state. The PMOS transistor 110 will be turned on and the node 118 will be at a high state. The PMOS transistor 108 will be turned off by the complementary input signal MWLB, which is the inverted signal of the input signal MWL. The high signal at the node 118 will turn off the PMOS transistor 114 and turn on the NMOS transistor 102, thereby pulling the node 122 low to provide a low output signal. A substantial leakage current can occur across the gate of the NMOS transistor 102. As the example discussed above, the gate leakage current can reach about 589 nA while the total leakage current of the word line driver 100 is only about 846 nA.

Figure 2:
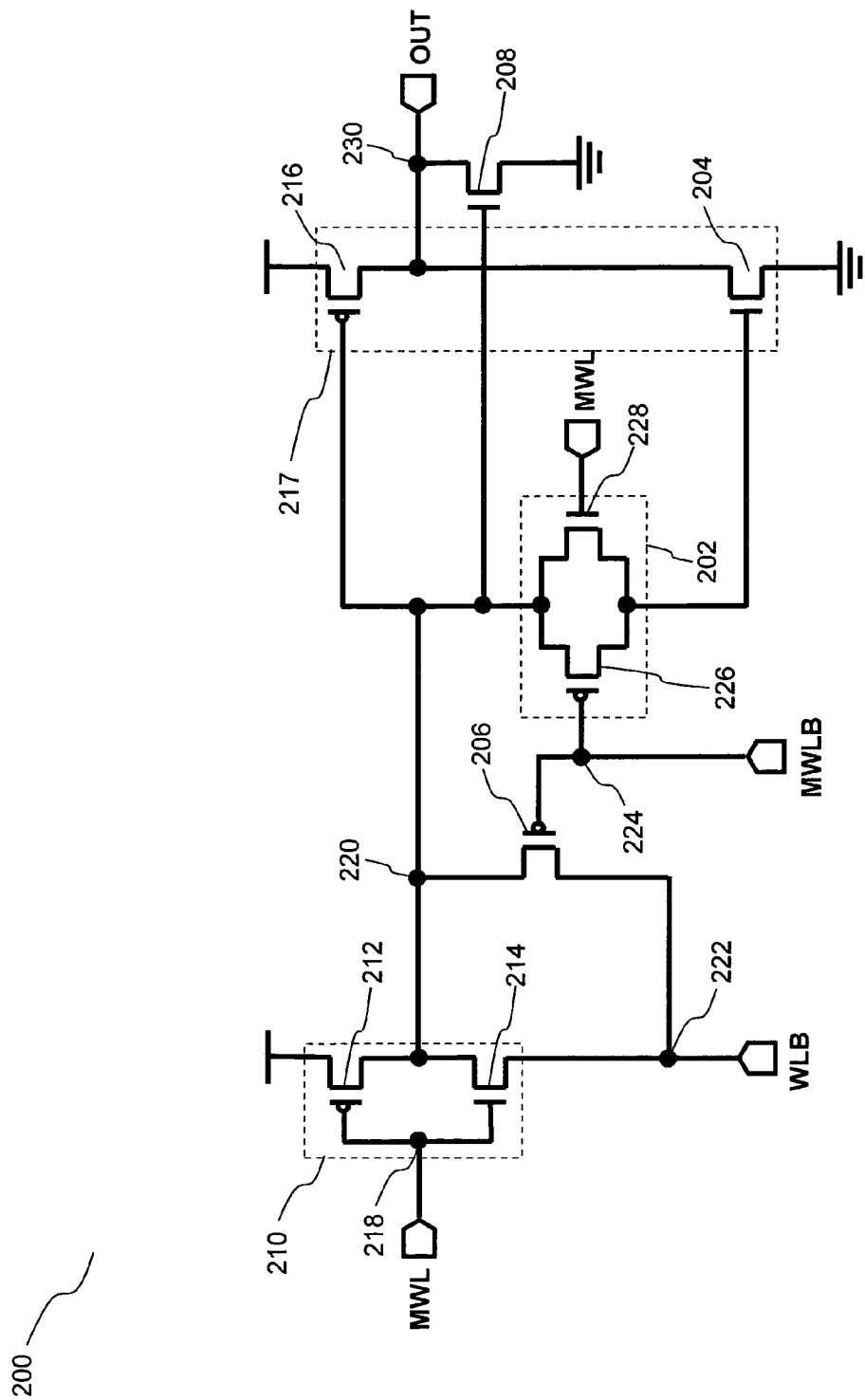
FIG. 2 illustrates a word line driver for a memory device in accordance with one embodiment of the present invention.

FIG. 2 illustrates a word line driver 200 for a memory device, such as SRAM, dynamic random access memory (DRAM), read only memory (ROM) and flash memory, in accordance with one embodiment of the present invention. The circuit 200 is implemented with a blockage module 202 for reducing the leakage current at the gate of an NMOS transistor 204 during the standby mode. The word line driver 200 includes two stages of inverters 210 and 217, a PMOS transistor 206 and an NMOS transistor 208. The inverter 210 includes a PMOS transistor 212 and an NMOS transistor 214, while a PMOS transistor 216 and the NMOS transistor 204 together form the inverter 217. The gates of the PMOS transistor 212 and the NMOS transistor 214 are coupled together at a node 218, which serves as an input terminal of the inverter 210 for receiving an input signal MWL. The source of the PMOS transistor 212 is tied to the supply voltage while both drains of the PMOS transistor 212 and the NMOS transistor 214 are coupled together at a node 220, which can be seen as an output terminal of the inverter 210. The source of the NMOS transistor 214 is connected to a node 222 where a signal WLB is provided. The drain of the PMOS transistor 206 is also connected to the node 222, while its source is coupled to the coupling node 220. A complementary input signal MWLB, which has an opposite value to the input signal MWL, is provided at the gate of the PMOS transistor 206 through a node 224. The blockage module 202, which includes a PMOS transistor 226 and an NMOS transistor 228, is implemented between the node 220 and the gate of the NMOS transistor 204, which can be seen as one input terminal of the inverter 217. The gate of the PMOS transistor 216, which can be seen as another input node of the inverter 217, and the blockage module 202 are coupled together at the node 220. The source of the PMOS transistor 216 is tied to the supply voltage, and the source of the NMOS transistor 204 is coupled to the complementary supply voltage, such as ground. The drains of the PMOS transistor 216 and the NMOS transistor 204 are coupled together at a node 230, which can be seen as an output terminal of the inverter 217 for carrying out its output signal. The NMOS transistor 208, whose drain is coupled to the node 230, can be seen as a tie-down transistor. The gate of the NMOS transistor 208 is coupled to the node 220, while its source is tied to the complementary supply voltage. The NMOS transistor 208 is designed to keep the output signal at the node 230 from floating during the standby mode.

The input signal MWL and the signal WLB are designed to be at opposite states, similar to the complementary input signal MWLB. During the normal operation, when the input signal MWL at the node 218 is at a high state, the signal WLB at the node 222 will be at a low state. The NMOS transistor 214 will be turned on, and the node 220 will be at a low state. The PMOS transistor 206 will be turned on by the complementary input signal MWLB, which is the inverted signal of the input signal MWL, further pulling the node 220 to a low state. The low signal at the node 220 will turn on the PMOS transistor 216. Meanwhile, within the blockage module 202, the PMOS transistor 226 with its gate tied to the node 224 is turned on by the low state complementary input signal MWLB. At the same time, since the gate of the NMOS transistor 228 is tied directly to the high state input signal MWL, it is also turned on. This allows the low signal at the node 220 to reach the gate of the NMOS transistor 204, thereby turning off the NMOS transistor 204. As a result, the node 230 is pulled high to the supply voltage, thereby generating a high output signal. Note that the NMOS transistor 208 is turned off by the low signal at the node 220 during the normal operation.

In the standby mode, when the input signal MWL at the node 218 is at a low state, the signal WLB at the node 222 will be a high state. The PMOS transistor 212 will be turned on and the node 220 will be at a high state. The PMOS transistor 206 will be turned off by the complementary input signal MWLB, which is the inverted signal of the input signal MWL. The high signal at the node 220 will turn off the PMOS transistor 216. Meanwhile, both the PMOS transistor 226 and the NMOS transistor 228 within the blockage module 202 will be turned off by its corresponding input signal and its complement. This keeps the NMOS transistor 204 turned off. The NMOS transistor 208 will be turned on by the high signal at the node 220 to pull the node 230 low for avoiding it from floating.

By implementing the blockage module 202, the leakage current across the gate of the NMOS transistor 204 is greatly reduced during the standby mode. For example, as the word line driver 200 is designed to have the NMOS transistor 204 with a width of 3.8 μm and a length of 0.1 μm, the gate leakage current of the same is reduced to 5.28 nA during the standby mode where the supply voltage is lowered to about 1.2 volts. Compared to the conventional word line driver, this saves 40 to 60 percent of the standby power consumption. By using the blockage module 202 to control the path of the NMOS transistor 204, no distortion of the gate control signal will occur. Since the control signals used by the blockage module 202 are the same as the input signal and its complement, no specially designed control signals will be necessary.

Note that a signal NMOS or PMOS transistor can be used to replace the blockage module 202 for reducing the gate leakage current at the NMOS transistor 204. However, since a single NMOS transistor or PMOS transistor may not realize the full potential of the gate control signal of the NMOS transistor 204, the output signal from the inverter 217 may be distorted as opposed to the input signal received by the inverter 210.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A circuit system comprising:
a first inverter coupled between a supply voltage and a complementary input signal, for generating a first output signal on an output terminal thereof in response to an input signal received by an input terminal thereof;
a blockage module coupled to the output terminal of the first inverter for selectively passing the first output signal there across in response to the input signal and the complementary input signal; and
a second inverter coupled between the supply voltage and a complementary supply voltage, having a first input terminal directly coupled to the output terminal of the first inverter and a second input terminal coupled to the same via the blockage module for generating a second output signal in response to the first output signal, wherein the blockage module prevents the first output signal from passing to the second input terminal of the second inverter when the input signal is at a low level and the complementary input signal is at a high level, thereby reducing a leakage current at the second inverter.

2. The circuit system of claim 1, wherein the blockage module further comprises a first PMOS transistor having a source connected to the output terminal of the first inverter, a drain connected to the second input terminal of the second inverter, and a gate controlled by the complementary input signal.

3. The circuit system of claim 2, wherein the blockage module further comprises a first NMOS transistor having a drain connected to the output terminal of the first inverter, a source connected to the second input terminal of the second inverter, and a gate controlled by the input signal.

4. The circuit system of claim 3 further comprising a second PMOS transistor coupled between the output terminal of the first inverter and the complementary input signal, having a gate controlled by the complementary input signal.

5. The circuit system of claim 4 further comprising a second NMOS transistor coupled between an output terminal of the second inverter and the complementary supply voltage, having a gate connected to the output terminal of the first inverter for ensuring the second output signal is at a low level when the input signal is at a low level.

6. The circuit system of claim 5, wherein the first inverter further comprises a third PMOS transistor having a source connected to the supply voltage, a gate connected to the input terminal of the first inverter, and a drain connected to the output terminal of the first inverter.

7. The circuit system of claim 6, wherein the first inverter further comprises a third NMOS transistor having a source connected to the complementary input signal, a gate connected to the input terminal of the first inverter, and a drain connected to the output terminal of the first inverter.

8. The circuit system of claim 7, wherein the second inverter further comprises a fourth PMOS transistor having a source connected to the supply voltage, a gate connected to the output terminal of the first inverter, a drain connected to the output terminal of the second inverter.

9. The circuit system of claim 8, wherein the second inverter further comprises a fourth NMOS transistor having a source connected to the complementary supply voltage, a drain connected to the output terminal of the second inverter, and a gate connected to the drain of the first PMOS transistor and the source of the first NMOS transistor.

10. A word line driver for a memory device, comprising:
a first inverter coupled between a supply voltage and a complementary input signal, for generating a first output signal on an output terminal thereof in response to an input signal received by an input terminal of thereof;
a first PMOS transistor having a source connected to the output terminal of the first inverter and a gate controlled by the complementary input signal;
a first NMOS transistor having a drain connected to the output terminal of the first inverter, a source connected to the drain of the first PMOS transistor, and a gate controlled by the input signal; and
a second inverter coupled between the supply voltage and a complementary supply voltage, having a first input terminal directly coupled to the output terminal of the first inverter and a second input terminal coupled to the drain of the first PMOS transistor and the source of the first NMOS transistor, for generating a second output signal in response to the first output signal, wherein the first PMOS and NMOS transistor together prevent the first output signal from passing to the second input terminal of the second inverter when the input signal is at a low level and the complementary input signal is at a high level, thereby reducing a leakage current at the second inverter.

11. The word line driver of claim 10 further comprising a second PMOS transistor coupled between the output terminal of the first inverter and the complementary input signal, having a gate controlled by the complementary input signal.

12. The word line driver of claim 11 further comprising a second NMOS transistor coupled between an output terminal of the second inverter and the complementary supply voltage, having a gate connected to the output terminal of the first inverter for ensuring the second output signal is at a low level when the input signal is at a low level.

13. The word line driver of claim 12, wherein the first inverter further comprises a third PMOS transistor having a source connected to the supply voltage, a gate connected to the input terminal of the first inverter, and a drain connected to the output terminal of the first inverter.

14. The word line driver of claim 13, wherein the first inverter further comprises a third NMOS transistor having a source connected to the complementary input signal, a gate connected to the input terminal of the first inverter, and a drain connected to the output terminal of the first inverter.

15. The word line driver of claim 14, wherein the second inverter further comprises a fourth PMOS transistor having a source connected to the supply voltage, a gate connected to the output terminal of the first inverter, a drain connected the output terminal of the second inverter.

16. The word line driver of claim 15, wherein the second inverter further comprises a fourth NMOS transistor having a source connected to the complementary supply voltage, a drain connected to the output terminal of the second inverter, and a gate connected to the drain of the first PMOS transistor and the source of the first NMOS transistor.

17. A word line driver for a static random access memory (SRAM) device, comprising:
a first inverter coupled between a supply voltage and a complementary input signal, for generating a first output signal on an output terminal thereof in response to an input signal received by an input terminal thereof;
a first PMOS transistor having a source connected to the output terminal of the first inverter and a gate controlled by the complementary input signal;
a first NMOS transistor having a drain connected to the output terminal of the first inverter, a source connected to the drain of the first PMOS transistor, and a gate controlled by the input signal;
a second inverter coupled between the supply voltage and a complementary supply voltage, having a first input terminal directly coupled to the output terminal of the first inverter and a second input terminal coupled to the drain of the first PMOS transistor and the source of the first NMOS transistor, for generating a second output signal in response to the first output signal; and
a second NMOS transistor coupled between an output terminal of the second inverter and the complementary supply voltage, having a gate connected to the output terminal of the first inverter for ensuring the second output signal is at a low level when the input signal is at a low level,
wherein the first PMOS and NMOS transistor together prevent the first output signal from passing to the second input terminal of the second inverter when the input signal is at a low level and the complementary input signal is at a high level, thereby reducing a leakage current at the second inverter.

18. The word line driver of claim 17 further comprising a second PMOS transistor coupled between the output terminal of the first inverter and the complementary input signal, having a gate controlled by the complementary input signal.

19. The word line driver of claim 18, wherein the first inverter further comprises a third PMOS transistor and a third NMOS transistor serially coupled between the supply voltage and the complementary input signal, having their gates connected to the input terminal of the first inverter, and their drains connected to the output terminal of the same.

20. The word line driver of claim 19, wherein the second inverter further comprises a fourth PMOS transistor and a forth NMOS transistor serially coupled between the supply voltage and the complementary supply voltage, the fourth PMOS transistor having a gate connected to the first input terminal of the second inverter, and the fourth NMOS transistor having a gate connected to the second input terminal of the same.

* * * * *